United States Patent
Kidoh (10) Patent No.: US 7,400,218 B2
(45) Date of Patent: Jul. 15, 2008

(54) SURFACE ACOUSTIC WAVE FILTER

(75) Inventor: Hideo Kidoh, Kanazawa (JP)

(73) Assignee: Murata Manufacturing Co., Ltd., Kyoto (JP)

(*) Notice: Subject to any disclaimer, the term of this patent is extended or adjusted under 35 U.S.C. 154(b) by 34 days.

(21) Appl. No.: 10/954,477

(22) Filed: Oct. 1, 2004

(65) Prior Publication Data
US 2005/0099247 A1    May 12, 2005

(30) Foreign Application Priority Data
Nov. 12, 2003 (JP) .............................. 2003-382390

(51) Int. Cl.
 *H03H 9/00* (2006.01)
 *H01L 41/00* (2006.01)
(52) U.S. Cl. ...................... 333/193; 333/133
(58) Field of Classification Search ............... 333/133, 333/193, 196; 310/313 B
See application file for complete search history.

(56) References Cited

U.S. PATENT DOCUMENTS

| 4,203,082 | A | * | 5/1980 | Tsukamoto et al. | ......... 333/194 |
| 4,600,905 | A | * | 7/1986 | Fredricksen | ................ 333/196 |
| 4,878,036 | A | | 10/1989 | Yatsuda et al. | |
| 4,973,875 | A | * | 11/1990 | Yatsuda | .................. 310/313 D |

(Continued)

FOREIGN PATENT DOCUMENTS

| JP | 51-114935 | 9/1976 |
| JP | 56-141612 | 11/1981 |
| JP | 09-181554 | 7/1997 |
| JP | 11-500593 | 1/1999 |
| JP | 2001-196897 A | 7/2001 |
| JP | 2001-237667 | 8/2001 |
| JP | 2002-057551 | 2/2002 |
| JP | 2003-101386 | 4/2003 |
| WO | 9710646 A1 | 3/1997 |

OTHER PUBLICATIONS

Official communication issued in the counterpart German Application No. 10134092.3, mailed on Jul. 30, 2007.

(Continued)

*Primary Examiner*—Dean O Takaoka
(74) *Attorney, Agent, or Firm*—Keating & Bennett, LLP (57) ABSTRACT

A surface acoustic wave filter includes a surface acoustic wave substrate, an input transducer, and an output transducer. The input and output transducers are arranged on a surface of the surface acoustic wave substrate. Each of the input and output transducers includes a plurality of electrode fingers that is slanted in a direction that is substantially perpendicular to a surface acoustic wave propagation direction such that an electrode finger pitch changes in the direction that is substantially perpendicular to the surface acoustic wave propagation direction. An electrode finger pitch of a portion of the input transducer is different from an electrode finger pitch of a portion of the output transducer that corresponds to the portion of the input transducer in the surface acoustic wave propagation direction.

9 Claims, 5 Drawing Sheets

U.S. PATENT DOCUMENTS

| | | | | |
|---|---|---|---|---|
| 5,818,310 | A | * | 10/1998 | Solie .......................... 333/196 |
| 5,831,492 | A | | 11/1998 | Solie |
| 6,577,041 | B1 | * | 6/2003 | Martin .................... 310/313 B |
| 6,856,214 | B2 | * | 2/2005 | Jian et al. .................... 333/154 |
| 6,924,715 | B2 | * | 8/2005 | Beaudin et al. ............. 333/133 |

OTHER PUBLICATIONS

Campbell, C.: Surface Acoustic Wave Devices and Their Signal Processing Applications. Boston [u.a.]: Academic Press, Inc., 1989, S. 37-43 and 428-431.

Campbell, C.; u.a.: Wide-Band Linear Phase SAW Filter Design Using Slanted Transducer Fingers. In: IEEE Transactions on Sonics and Ultrasonics, vol. SU-29, No. 6, 1982, S. 224-228.

Official communication issued in counterpart Japanese Application No. 2003-382390, mailed on Nov. 6, 2007.

* cited by examiner

SURFACE ACOUSTIC WAVE FILTER

BACKGROUND OF THE INVENTION

1. Field of the Invention

The present invention relates to transversal surface acoustic wave filters in which an input transducer and an output transducer are arranged on the surface of a surface acoustic wave substrate, and more particularly, to a surface acoustic wave filter in which each of the input and output transducers includes a plurality of oblique electrode fingers having an electrode finger pitch that changes along a direction that is substantially perpendicular to a surface acoustic wave propagation direction.

2. Description of the Related Art

Outstanding in-band flatness and selectivity (steepness of a shifting area shifting from a pass band to an out band) are required for intermediate-frequency (IF) filters for satellite digital audio radio service (SDARS) tuners. Also, a wide variety of filters, such as those ranging from relatively narrow-band filters having a band width ratio of approximately 2% to very wide-band filters having a band width ratio of approximately 20%, are required.

PCT Japanese National Phase Patent Publication No. 11-500593 discloses a method for increasing the bandwidth of a surface acoustic wave filter. In this method, so-called slanted transducers are used. In the slanted transducers, an electrode finger pitch of input and output transducers changes along a direction perpendicular to a propagation direction of surface acoustic waves. In other words, electrode fingers extend in an oblique direction with respect to the direction perpendicular to the propagation direction of surface acoustic waves. A transversal surface acoustic wave filter using slanted single-phase unidirectional transducers (SPUDTs) is described in PCT Japanese National Phase Patent Publication No. 11-500593. Since the input and output transducers are slanted transducers, an electrode finger pitch is different in the direction perpendicular to the surface acoustic wave propagation direction. Thus, outstanding in-band flatness and a wider bandwidth is achieved.

However, in order to increase the selectivity of the surface acoustic wave filter described in PCT Japanese National Phase Patent Publication No. 11-500593, the number of pairs of electrode fingers must be increased. Thus, the size of the surface acoustic wave filter is increased. In addition, when the number of pairs of electrode fingers increases, the angle of inclination of electrode fingers near ends thereof in the surface acoustic wave propagation direction is increased. Thus, a direction of radiation of surface acoustic waves is greatly shifted from the surface acoustic wave propagation direction, and this deteriorates the characteristics of the surface acoustic wave filter.

SUMMARY OF THE INVENTION

In order to overcome the problems described above, preferred embodiments of the present invention provide a surface acoustic wave filter that includes slanted transducers and that is capable of increasing the bandwidth and the selectivity without increasing the number of pairs of electrode fingers.

A transversal surface acoustic wave filter according to a preferred embodiment of the present invention includes a surface acoustic wave substrate, an input transducer arranged on a surface of the surface acoustic wave substrate, and an output transducer arranged on the surface of the surface acoustic wave substrate. Each of the input transducer and the output transducer includes a plurality of electrode fingers slanted in a direction that is substantially perpendicular to a surface acoustic wave propagation direction such that an electrode finger pitch changes in the direction that is substantially perpendicular to the surface acoustic wave propagation direction. An electrode finger pitch of a portion of the input transducer is different from an electrode finger pitch of a portion of the output transducer that corresponds to the portion of the input transducer in the surface acoustic wave propagation direction.

In other words, in a transversal surface acoustic wave filter including slanted input and output transducers, since an electrode finger pitch of a portion of the input transducer is different from an electrode finger pitch of a portion of the output transducer that corresponds to the portion of the input transducer in the surface acoustic wave propagation direction, steepness of the filter characteristics, that is, selectivity, is increased without increasing the number of pairs. Thus, a wider bandwidth is achieved by using slanted input and output transducers. Furthermore, a compact surface acoustic wave filter having outstanding selectivity is provided.

A center frequency of the input transducer is preferably different from a center frequency of the output transducer. In this case, an electrode finger pitch of a portion of the input transducer is different from an electrode finger pitch of a portion of the output transducer that corresponds to the portion of the input transducer in the surface acoustic wave propagation direction.

A ratio between the minimum electrode finger pitch and the maximum electrode finger pitch in the input transducer is preferably equal to a ratio between the minimum electrode finger pitch and the maximum electrode finger pitch in the output transducer. In this case, outstanding flatness of the pass band of the filter is achieved.

All of the ratios of electrode finger pitches between portions of the input transducer and portions of the output transducer that correspond to the portions of the input transducer in a direction that is substantially parallel to the surface acoustic wave propagation direction are preferably equal to each other. In this case, outstanding flatness of the pass band of the filter is achieved.

At least one of the input transducer and the output transducer is preferably a single-phase unidirectional transducer. In this case, a reduction in the loss of the surface acoustic wave filter is achieved without increasing a ripple due to triple transit echo (TTE).

These and various other features, elements, steps, characteristics and advantages of the present invention will become more apparent from the following detailed description of preferred embodiments thereof with reference to the attached drawings.

DETAILED DESCRIPTION OF PREFERRED EMBODIMENTS

Preferred embodiments of the present invention will be described with reference to the drawings.

Figure 1:
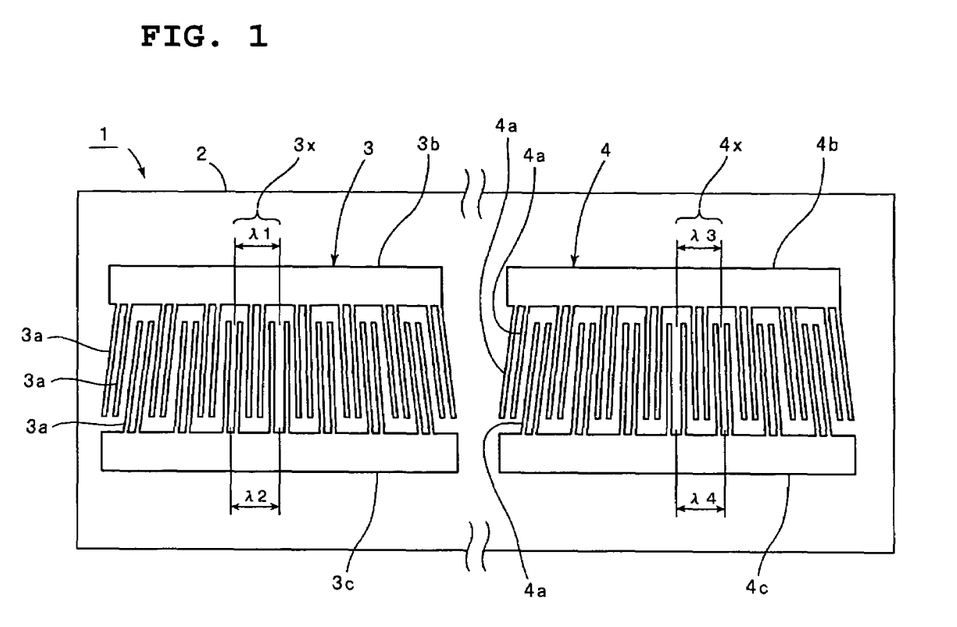
FIG. 1 is a plan view showing a surface acoustic wave filter according to a preferred embodiment of the present invention.

FIG. 1 is a schematic plan view showing a surface acoustic wave filter 1 according to a preferred embodiment of the present invention.

The surface acoustic wave filter 1 includes a substantially rectangular surface acoustic wave substrate 2, an input transducer 3, and an output transducer 4. The input transducer 3 and the output transducer 4 are arranged on the surface acoustic wave substrate 2.

The surface acoustic wave substrate 2 may be a piezoelectric substrate. Alternatively, the surface acoustic wave substrate 2 may include a piezoelectric substrate or an insulation substrate and a piezoelectric thin film arranged on the piezoelectric substrate or on the insulation substrate.

Electrodes having a shape shown in FIG. 1 on the surface acoustic wave substrate 2 define the input transducer 3 and the output transducer 4. The input transducer 3 and the output transducer 4 are spaced from each other in the surface acoustic wave propagation direction and define a transversal surface acoustic wave filter.

As shown in FIG. 1, in the surface acoustic wave filter 1 according to this preferred embodiment, the input transducer 3 and the output transducer 4 are slanted transducers. The slanted input and output transducers 3 and 4 include a plurality of electrode fingers 3a and 4a, respectively, that is slanted with respect to a direction that is substantially perpendicular to the surface acoustic wave propagation direction and in which an electrode finger pitch changes in the direction that is substantially perpendicular to the surface acoustic wave propagation direction.

For example, in the input transducer 3 shown in FIG. 1, in a portion 3x in which four central electrode fingers are arranged, an electrode finger pitch λ1 near a bus bar 3b is different from an electrode finger pitch λ2 near a bus bar 3c.

Similarly, in the output transducer 4, in a portion 4x in which four central electrode fingers are arranged in the surface acoustic wave propagation direction, an electrode finger pitch λ3 near a bus bar 4b is different from an electrode finger pitch λ4 near a bus bar 4c.

In the slanted input and output transducers 3 and 4, the electrode finger pitch changes in the direction that is substantially perpendicular to the surface acoustic wave propagation direction. Thus, a wider pass band is achieved, as compared to a case where normal transducers in which all the plurality of electrode fingers extends in the direction that is substantially perpendicular to the surface acoustic wave propagation direction are used.

Also, in the surface acoustic wave filter 1 according to this preferred embodiment, an electrode finger pitch of a portion of the input transducer 3 is different from an electrode finger pitch of a portion of the output transducer 4 that corresponds to the portion of the input transducer 3 in the surface acoustic wave propagation direction. In other words, for example, an electrode finger pitch of a portion 3x of the input transducer 3 is different from an electrode finger pitch of a portion 4x of the output transducer 4 that corresponds to the portion 3x of the input transducer 3 in the surface acoustic wave propagation direction. As shown in FIG. 1, the portion 3x of the input transducer 3 and the portion 4x of the output transducer 4 are arranged symmetrically to each other with respect to the center between the input transducer 3 and the output transducer 4. In this preferred embodiment, the electrode finger pitch λ1 is different from the electrode finger pitch λ3, and the electrode finger pitch λ2 is different from the electrode finer pitch λ4, as shown in FIG. 1.

In this preferred embodiment, since the electrode finger pitch λ1 is different from the electrode finger pitch λ3 and the electrode finger pitch 2 is different from the electrode finger pitch λ4, steepness in a shifting area, in other words, selectivity is increased. This will be explained based on specific examples.

As shown in Table 1, surface acoustic wave filters according to Working Examples 1 to 4 and surface acoustic wave filters according to Comparative Examples 1 to 4 are prepared by forming various input transducers and output transducers on piezoelectric substrates made of lithium tantalate ($LiTaO_3$).

In Working Examples 1 to 4, the numbers of pairs of electrode fingers of the input transducers and the output transducers are described below, and the total numbers of pairs of electrode fingers are 57, 49, 43, and 35, respectively. In Working Examples 1 to 4, the amounts of pitch changes between the input transducers and the output transducers are approximately 1.686%, 1.784%, 2.274%, and 2.761%, respectively. Here, the amount of a pitch change between an input transducer and an output transducer is represented by $1-(\lambda_1/\lambda_3)$ or $1-(\lambda_2/\lambda_4)$ for the electrode finger pitches $\lambda_1$ to $\lambda_4$ shown in FIG. 1, and satisfies the equation: $1-(\lambda_1/\lambda_3)=1-(\lambda_2/\lambda_4)$.

Also, the maximum angles of inclination of the electrode fingers according to Working Examples 1 to 4 are shown in Table 1. The maximum angle of inclination of the electrode fingers is an angle of an electrode finger having the maximum angle with respect to a direction that is substantially perpendicular to the surface acoustic wave propagation direction.

Needless to say, the maximum angle of inclination of an interdigital electrode transducer (IDT) changes in accordance with a change in the number of pairs of electrode fingers. The maximum angle of inclination increases in accordance with an increase in the number of pairs of electrode fingers.

For comparison, the surface acoustic wave filters according to Comparative Examples 1 to 4 including input and output transducers each including electrode fingers whose number of pairs is shown in Table 1 are prepared. In the surface acoustic wave filters according to Comparative Examples 1 to 4, the amount of a pitch change between the input and output transducer is set to 0. Also, in Comparative Examples 1 to 4, slanted input and output transducers are used, and the maximum angles of inclination of the IDTs are as shown in Table 1.

TABLE 1

|  | Total Number of Pairs (Pair) | Number of Pairs for Input Transducer (Pair) | Number of Pairs for Output Transducer (Pair) | Amount of Pitch Change between Input and Output Transducers (%) | Maximum Angle of Inclination of IDT (°) |
| --- | --- | --- | --- | --- | --- |
| Comparative Example 1 | 57 | 32.5 | 24.5 | 0 | 7.93 |
| Comparative Example 2 | 50 | 28.5 | 21.5 | 0 | 6.96 |

TABLE 1-continued

|  | Total Number of Pairs (Pair) | Number of Pairs for Input Transducer (Pair) | Number of Pairs for Output Transducer (Pair) | Amount of Pitch Change between Input and Output Transducers (%) | Maximum Angle of Inclination of IDT (°) |
|---|---|---|---|---|---|
| Comparative Example 3 | 43 | 24.5 | 18.5 | 0 | 5.99 |
| Comparative Example 4 | 36 | 20.5 | 15.5 | 0 | 5.02 |
| Working Example 1 | 57 | 28.5 | 28.5 | 1.686 | 7.0 |
| Working Example 2 | 49 | 24.5 | 24.5 | 1.784 | 6.1 |
| Working Example 3 | 43 | 21.5 | 21.5 | 2.274 | 5.3 |
| Working Example 4 | 35 | 17.5 | 17.5 | 2.761 | 4.4 |

According to a study conducted by the inventor of this application, if the total numbers of pairs of electrode fingers for Working Examples 1 to 4 are equal to the total numbers of pairs of electrode fingers for corresponding Comparative Examples 1 to 4, the shape factors (SFs) of Working Examples 1 to 4 are close to 1 compared with those of corresponding Comparative Examples 1 to 4. Thus, in Working Examples 1 to 4, the steepness of the filter characteristics is increased. This will be explained with reference to FIGS. 2 and 3.

Figure 2:
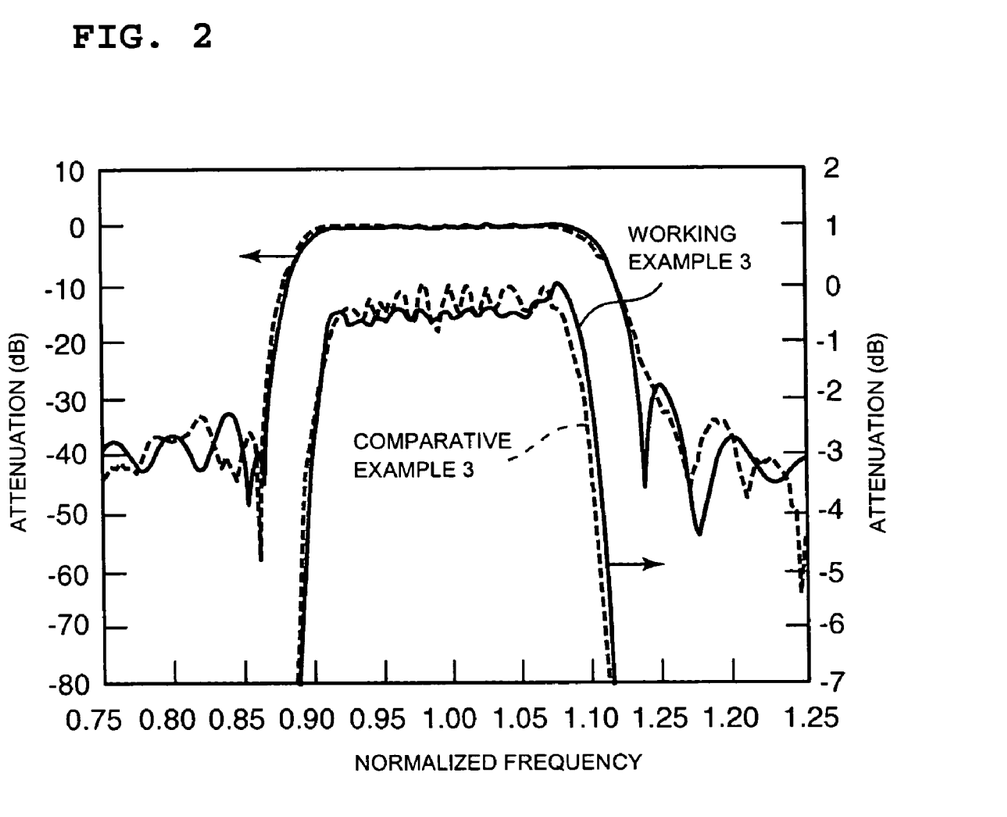
FIG. 2 shows the attenuation-frequency characteristics of surface acoustic wave filters according to Working Example 3 and Comparative Example 3.

FIG. 2 shows the attenuation-frequency characteristics of the surface acoustic wave filters according to Working Example 3 and Comparative Example 3 shown in Table 1. In FIG. 2, the characteristics shown at the center represent the attenuation-frequency characteristics magnified by a scale at the right side. Also, in FIG. 2, the solid lines represent the results of Working Example 3, and the broken lines represent the results of Comparative Example 3.

As shown in FIG. 2, the surface acoustic wave filter according to Working Example 3 exhibits an increased steepness of the filter characteristics compared with the surface acoustic wave filter according to Comparative Example 3. Working Example 3 exhibits an SF of 1.31. In contrast, Comparative Example 3 exhibits an SF of 1.38. The SFs are obtained as ratios between a 20 dB bandwidth and a 1.5 dB bandwidth on the basis of the minimum insertion loss point of the filters. Thus, an SF closer to 1 represents a higher steepness in a shifting area. The increase in the steepness of the filter characteristics of Working Example 3 compared with Comparative Example 3 can be seen not only from the waveforms shown in FIG. 2 but also by comparing the SF values.

Figure 3:
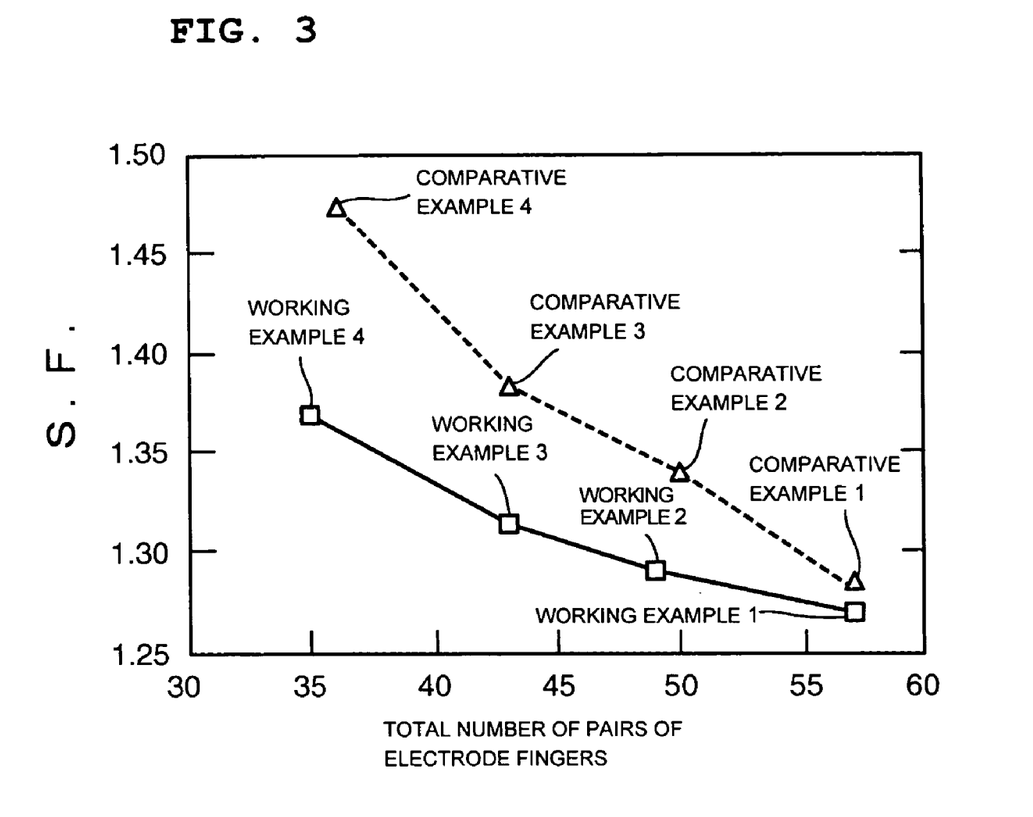
FIG. 3 shows the shape factors of surface acoustic wave filters according to Working Examples 1 to 4 and Comparative Examples 1 to 4.

Also, the SF values of Working Examples 1, 2, and 4, and Comparative Examples 1, 2, and 4 are also shown in FIG. 3, together with Working Example 3 and Comparative Example 3.

As is clear from FIG. 3, the surface acoustic wave filters according to Working Examples 1 to 4 exhibit SFs closer to 1 as compared to corresponding Comparative Examples 1 to 4 whose numbers of pairs of electrode fingers are similar to corresponding Working Examples 1 to 4. Thus, the steepness of the filter characteristics of each of the surface acoustic wave filters according to Working Examples 1 to 4 are efficiently increased.

In order to increase the selectivity using slanted input and output transducers, when each of the input and output transducers is divided into a plurality of tracks to the extent that the angle of inclination of electrode fingers in the direction that is substantially perpendicular to the surface acoustic wave propagation direction is negligible, the frequency characteristics of each of the tracks must exhibit a bandwidth as narrow as possible. When the number of pairs of IDTs is constant, using normal electrodes enables each of the tracks to have the narrowest bandwidth, and the bandwidth is inversely proportional to the number of pairs of electrode fingers. A reduction in the number of pairs of electrode fingers increases the bandwidth of each of the tracks, and this reduces the selectivity of the slanted transducers. In other words, even if the number of pairs of electrode fingers is reduced, when the bandwidth of each of the divided tracks is individually reduced, a reduction in the size of the slanted transducers can be achieved without reducing the selectivity of the slanted transducers. In view of the above points, in preferred embodiments of the present invention, in order to further reduce the bandwidth of each of the divided tracks individually, an electrode finger pitch of the input transducer is different from an electrode finger pitch of the output transducer.

Figure 4:
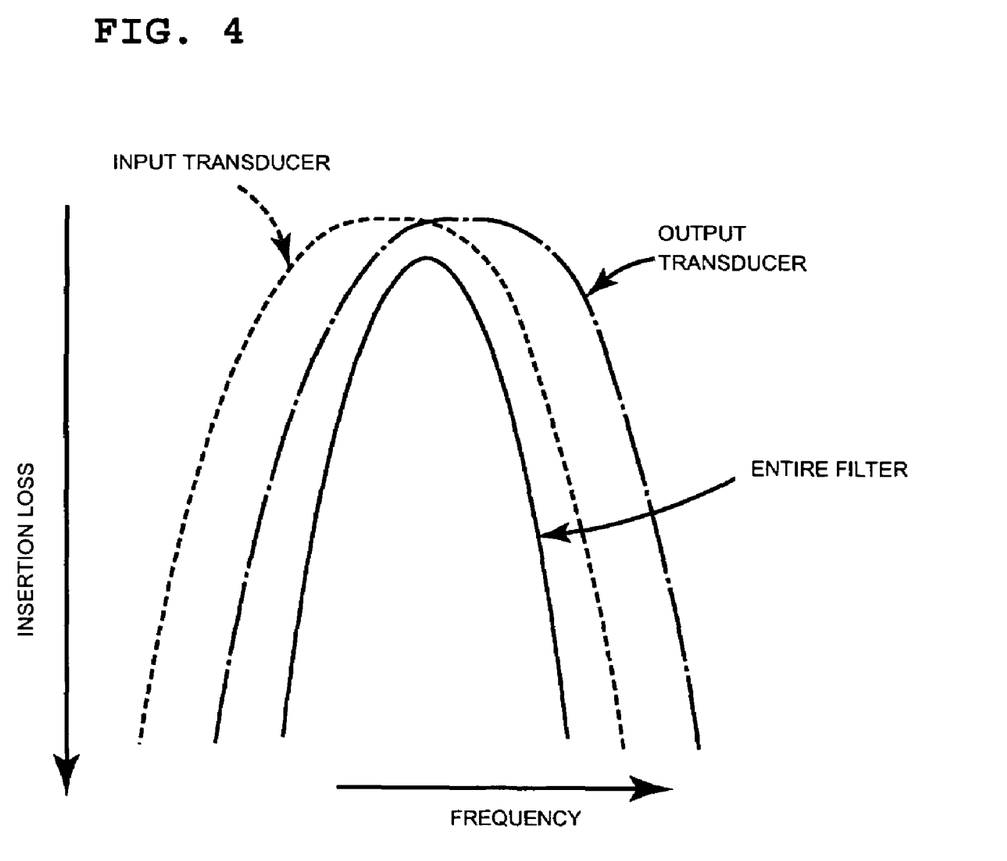
FIG. 4 shows the reason why a difference in the center frequency between normal input and output transducers achieves a narrower bandwidth.

FIG. 4 shows the reason why making an electrode finger pitch of an input transducer different from an electrode finger pitch of an output transducer in a transversal filter including the input and output transducers that are not slanted achieves a narrow-band filter. In this case, as shown in FIG. 4, the center frequency of the attenuation-frequency characteristics of the input transducer represented by the short dash line is shifted from the center frequency of the attenuation-frequency characteristics of the output transducer represented by the alternating long and short dash line. Here, the solid line represents the frequency characteristics of the entire surface acoustic wave filter.

The frequency characteristics shown by the solid line in the transversal surface acoustic wave filter are obtained as the product of the frequency characteristics of the input transducer and the frequency characteristics of the output transducer. Thus, as shown in FIG. 4, the narrow-band characteristics can be achieved.

If there is a large difference in the electrode finger pitch between the input transducer and the output transducer, the efficiency of conversion between surface acoustic waves and electrical signals is reduced, thus increasing insertion loss. Since the change ratio of the electrode finger pitch has an optimal value for a bandwidth of each of the input and output transducers, the electrode finger pitch should be set in accordance with the optimal value.

In other words, the compact and wide-band surface acoustic wave filter according to the preferred embodiment described above having outstanding selectivity is obtained by slanting electrode fingers so as to achieve a required bandwidth on the basis of an arrangement of a transversal surface acoustic wave filter using normal input and output transducers, which are not slanted, in which a narrower bandwidth can be achieved by setting the pitch between the input and output transducers to be different from one another, as shown in FIG. 4.

Figure 5:
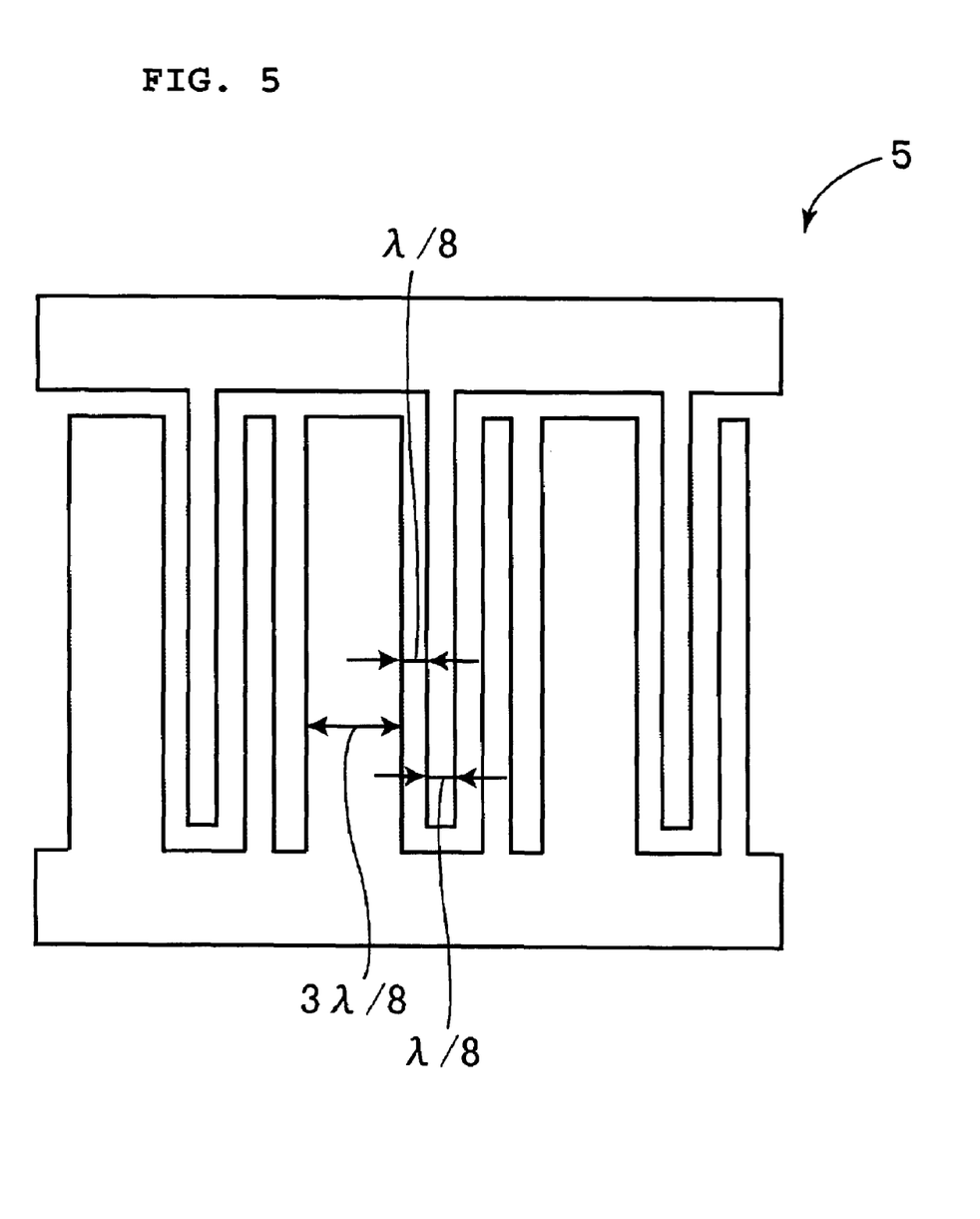
FIG. 5 is a plan view showing an example of a single-phase unidirectional transducer used in the present invention.

In FIG. 1, the input and output transducers are defined by split electrodes in which a plurality of adjacent electrode fingers is connected to the same bus bar. However, the split electrodes are not necessarily used in preferred embodiments of the present invention. If at least one of the input transducer and the output transducer is, for example, an SPUDT 5 shown in FIG. 5, an increase of a ripple due to TTE is prevented. Thus, a reduction in the loss of the surface acoustic wave filter is achieved.

In addition, performing withdrawal weighting on at least one of the input transducer and the output transducer can increase the out-of-band attenuation.

It should be understood that the foregoing description is only illustrative of the present invention. Various alternatives and modifications can be devised by those skilled in the art without departing from the present invention. Accordingly, the present invention is intended to embrace all such alternatives, modifications and variations that fall within the scope of the appended claims.

What is claimed is:

1. A transversal surface acoustic wave filter comprising:
   a surface acoustic wave substrate;
   an input transducer arranged on a surface of the surface acoustic wave substrate; and
   an output transducer arranged on the surface of the surface acoustic wave substrate, the input transducer and the output transducer each including a plurality of electrode fingers slanted in a direction that is substantially perpendicular to a surface acoustic wave propagation direction such that an electrode finger pitch changes in the direction that is substantially perpendicular to the surface acoustic wave propagation direction; wherein
   when each of the input and output transducers is divided into a plurality of tracks to the extent that an angle of inclination of electrode fingers in a direction that is substantially perpendicular to a surface acoustic wave propagation direction is negligible, an electrode finger pitch of a track of the plurality of tracks of the input transducer is different from an electrode finger pitch of a track of the plurality of tracks of the output transducer; and
   the electrode finger pitch is defined by a distance between a first electrode finger and a second electrode finger which has the same phase as the first electrode finger in the input and output transducers.

2. The surface acoustic wave filter according to claim 1, wherein a center frequency of the input transducer is different from a center frequency of the output transducer.

3. The surface acoustic wave filter according to claim 1, wherein a ratio between the minimum electrode finger pitch and the maximum electrode finger pitch in the input transducer is equal to a ratio between the minimum electrode finger pitch and the maximum electrode finger pitch in the output transducer.

4. The surface acoustic wave filter according to claim 1, wherein all of the ratios of electrode finger pitches between portions of the input transducer and portions of the output transducer that correspond to the portions of the input transducer in a direction that is substantially parallel to the surface acoustic wave propagation direction are equal to each other.

5. The surface acoustic wave filter according to claim 1, wherein at least one of the input transducer and the output transducer is a single-phase unidirectional transducer.

6. The surface acoustic wave filter according to claim 1, wherein the input and output transducers are defined by split electrodes.

7. The surface acoustic wave filter according to claim 1, wherein said surface acoustic wave substrate is made of lithium tantalate.

8. The surface acoustic wave filter according to claim 1, wherein the maximum angle of inclination of the input transducer and the output transducer from a line that is substantially perpendicular to the surface acoustic wave propagation direction is between about 4.4° and about 7.0°.

9. The surface acoustic wave filter according to claim 1, wherein the amount of electrode pitch change between the input transducer and the output transducer is between about 1.686% and about 2.761%.

* * * * *